United States Patent
Onaka et al.

(10) Patent No.: US 10,284,165 B2
(45) Date of Patent: May 7, 2019

(54) VARIABLE PHASE SHIFTER, VARIABLE PHASE SHIFT CIRCUIT, RF FRONT-END CIRCUIT, AND COMMUNICATION APPARATUS

(71) Applicant: Murata Manufacturing Co., Ltd., Kyoto (JP)

(72) Inventors: Kengo Onaka, Kyoto (JP); Katsuhito Kuroda, Kyoto (JP); Yoshiki Yamada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/923,028

(22) Filed: Mar. 16, 2018

(65) Prior Publication Data
US 2018/0205358 A1    Jul. 19, 2018

Related U.S. Application Data

(63) Continuation of application No. PCT/JP2016/069223, filed on Jun. 29, 2016.

(30) Foreign Application Priority Data

Sep. 17, 2015 (JP) .................................. 2015-184286

(51) Int. Cl.
*H03H 7/20* (2006.01)
*H04B 1/12* (2006.01)
(Continued)

(52) U.S. Cl.
CPC ............... *H03H 7/20* (2013.01); *H04B 1/006* (2013.01); *H04B 1/12* (2013.01); *H01P 1/18* (2013.01); *H03H 7/38* (2013.01)

(58) Field of Classification Search
CPC ............... H03H 7/20; H04B 1/18; H04B 1/12
(Continued)

(56) References Cited

U.S. PATENT DOCUMENTS

| 6,741,207 B1 | 5/2004 | Allison et al. |
| 9,277,590 B2 | 3/2016 | Kokkinos et al. |

(Continued)

FOREIGN PATENT DOCUMENTS

| JP | S54-146143 U | 10/1979 |
| JP | S62-194701 A | 8/1987 |

(Continued)

OTHER PUBLICATIONS

International Search Report for International Application No. PCT/JP2016/069223, dated Sep. 13, 2016.
(Continued)

*Primary Examiner* — John J Lee
(74) *Attorney, Agent, or Firm* — Pearne & Gordon LLP

(57) ABSTRACT

A variable phase shift circuit has a phase shifter including a first port and a second port; a through path including a first port and a second port; a first switch including a first common port and configured to select the first port of the phase shifter or the first port of the through path and to connect the first port or the first port to the first common port; and a second switch including a second common port and configured to select the second port of the phase shifter or the second port of the through path and to connect the second port or the second port to the second common port. Phase shift amounts between the first common port and the second common port are switched in accordance with selections made by the first switch and the second switch.

17 Claims, 17 Drawing Sheets

(51) Int. Cl.
*H04B 1/00* (2006.01)
*H01P 1/18* (2006.01)
*H03H 7/38* (2006.01)

(58) Field of Classification Search
USPC .............................. 455/304, 303, 67.11, 139
See application file for complete search history.

(56) References Cited

U.S. PATENT DOCUMENTS

| | | | |
|---|---|---|---|
| 2004/0021526 A1* | 2/2004 | Jeong | H01P 1/185 333/32 |
| 2004/0155729 A1* | 8/2004 | Ko | H01P 1/184 333/164 |
| 2008/0180189 A1* | 7/2008 | Miya | H01P 1/18 333/103 |
| 2008/0186108 A1* | 8/2008 | Miya | H03H 11/16 333/139 |

FOREIGN PATENT DOCUMENTS

| | | |
|---|---|---|
| JP | S63-224510 A | 9/1988 |
| JP | H01-162001 A | 6/1989 |
| JP | 2679331 B2 | 11/1997 |
| JP | 2004-505479 A | 2/2004 |
| JP | 2008-187661 A | 8/2008 |
| JP | 2008-193309 A | 8/2008 |
| JP | 2014-511593 A | 5/2014 |

OTHER PUBLICATIONS

Written Opinion for International Application No. PCT/JP2016/069223, dated Sep. 13, 2016.

* cited by examiner frequency (0.5GHz to 3.0GHz)

frequency (0.5GHz to 3.0GHz)

frequency (0.5GHz to 3.0GHz)

frequency (0.5GHz to 3.0GHz)

VARIABLE PHASE SHIFTER, VARIABLE PHASE SHIFT CIRCUIT, RF FRONT-END CIRCUIT, AND COMMUNICATION APPARATUS

This is a continuation of International Application No. PCT/JP2016/069223 filed on Jun. 29, 2016 which claims priority from Japanese Patent Application No. 2015-184286 filed on Sep. 17, 2015. The contents of these applications are incorporated herein by reference in their entireties.

BACKGROUND

Technical Field

The present disclosure relates to a variable phase shifter that is connected to an antenna and shifts a phase by a certain amount, and a variable phase shift circuit, an RF front-end circuit, and a communication apparatus, each of them includes the variable phase shifter.

In general, in a high-frequency circuit including an antenna and a feeder circuit, a phase shifter is used for antenna matching in some cases. Existing phase shifters are of a high pass filter type and a low pass filter type, and a circuit constant is decided so as to obtain an intended phase shift amount at an intended frequency. For example, Patent Document 1 discloses a phase shifter that includes a high pass filter, a low pass filter, and a switch. The phase shifter is configured to select which of the high pass filter and the low pass filter to transmit a signal to by using the switch.

Patent Document 1: Japanese Patent No. 2679331

BRIEF SUMMARY

The phase shifter disclosed in Patent Document 1 includes the high pass filter and the low pass filter and has a structure in which phase shift amounts are switched depending on which of the high pass filter and the low pass filter to transmit a signal to, thus making it difficult to achieve a reduction in size and also resulting in a high insertion loss.

The present disclosure provides a phase shifter in which the number of circuit components has been reduced to promote a reduction in size and a reduction in insertion loss. The present disclosure further provides a variable phase shift circuit, an RF front-end circuit, and a communication apparatus, each of them includes the phase shifter.

(1) A variable phase shifter according to the present disclosure is a variable phase shifter connected to an antenna.

The variable phase shifter includes
a phase shifter including at least a first port and at least a second port;
a through path including at least a first port and at least a second port;
a first switch including a first common port and configured to select the first port of the phase shifter or the first port of the through path and to connect the selected first port of the phase shifter or the selected first port of the through path and the first common port; and
a second switch including a second common port and configured to select the second port of the phase shifter or the second port of the through path and to connect the selected second port of the phase shifter or the selected second port of the through path and the second common port.

In the above-described configuration, one transmission path selected by the first switch (single pole double throw switch: SPDT) is the through path (transmission line), and the number of circuit components is thus small, thereby promoting a reduction in size and a reduction in insertion loss. Furthermore, this facilitates setting to an intended phase shift amount.

(2) The phase shifter can include a lumped-constant LC circuit. This enables a phase shift action on a specific frequency band.

(3) In the above (1) or (2), the first switch, the second switch, and the through path can be configured as a single component. This reduces the number of components and a signal path length, thereby achieving a more effective reduction in size and a more effective reduction in insertion loss.

(4) A variable phase shifter according to the present disclosure is a variable phase shifter connected to an antenna.

The variable phase shifter includes
a phase shifter including at least a first port and at least a second port;
a through path including at least a first port and at least a second port; and
a switch including a common port and configured to select the first port of the phase shifter or the first port of the through path and to connect the selected first port of the phase shifter or the selected first port of the through path and the common port.

A line length of the through path is shorter than ¼ of a wavelength of a lowest frequency of communication frequencies that use the antenna.

The phase shifter is a phase shifter configured to shift a phase in a range from 85° to 95° inclusive at a specific frequency of the communication frequencies.

While the switch connects the common port with the first port of the through path, the first port of the phase shifter is grounded, and while the switch connects the common port with the first port of the phase shifter, the first port of the through path is opened.

In the above-described configuration, one transmission path selected by the switch is the through path, and the number of circuit components is thus small, thereby promoting a reduction in size and a reduction in insertion loss. Furthermore, a common connection is made between the second port of the phase shifter and the second port of the through path, thereby involving a small number of switches. The number of components and a signal path length are reduced, thereby achieving a more effective reduction in size and a more effective reduction in insertion loss.

(5) In the above (4), the line length of the through path can be shorter than 1/20 of the wavelength of the lowest frequency of the communication frequencies that use the antenna. Thus, the second port of the through path is equivalently open with the phase shifter being selected by the switch, thereby inhibiting changes in characteristics due to the presence of the through path.

(6) In the above (4) or (5), the phase shifter can include a lumped-constant LC circuit. This enables a phase shift action on a specific frequency band.

(7) In any of the above (4) to (6), there can be included a reactance circuit connected between the first port of the phase shifter and the ground, and while the switch connects the common port with the first port of the through path, the first port of the phase shifter can be grounded via the reactance circuit. This optimizes the termination conditions of the phase shifter with the through path being selected by the switch, and a phase shift action is appropriately performed by the through path.

(8) In the above (7), the reactance circuit can include at least a first capacitor, at least a second capacitor, and at least an inductor, the first capacitor and the inductor can constitute a series circuit, and the second capacitor can be connected in parallel with the series circuit. This enables the impedance of the reactance circuit to reach a low impedance in a low frequency band and to reach a high impedance or an intended impedance in a high frequency band. Thus, an open state is achieved in the low frequency band with the phase shifter being included. Furthermore, when a high impedance or an intended impedance is achieved in the high frequency band, a state close to 50 Ω can be maintained in a necessary frequency band with the common port and the first port of the through path being connected to each other, thereby making it possible to maintain matching in a plurality of frequency bands.

(9) In any of the above (4) to (8), there can be included a matching circuit connected to the common port of the switch or a common port connected to a common connection between the second port of the phase shifter and the second port of the through path.

The impedance of the phase shifter varies according to a frequency. Thus, in the above-described configuration, impedance matching is performed over a wide frequency band.

(10) In any of the above (4) to (9), the switch and the through path can be configured as a single component. This reduces the number of components and a signal path length, thereby achieving a more effective reduction in size and a more effective reduction in insertion loss.

(11) A variable phase shift circuit according to the present disclosure includes a plurality of the variable phase shifters according to any of the above (1) to (10), and the plurality of the variable phase shifters can be connected in cascade. Thus, a selection can be made from among phase shift amounts corresponding to four or more signal transmission paths.

(12) An RF front-end circuit according to the present disclosure is an RF front-end circuit connected between an antenna for a wide frequency band or a plurality of frequency bands and a feeder circuit. The RF front-end circuit includes a demultiplexing switching circuit configured to perform demultiplexing or switching of a high-frequency signal; and the variable phase shifter according to any of the above (1) to (10) or the variable phase shift circuit according to (11) connected between the demultiplexing switching circuit and a power-feeding unit of the antenna. This makes it possible to configure the RF front-end circuit in which a reduction in size and a reduction in insertion loss have been achieved.

(13) A communication apparatus according to the present disclosure includes an antenna for a wide frequency band or a plurality of frequency bands; and a feeder circuit (RFIC) for the antenna. The variable phase shifter according to any of the above (1) to (10) or the variable phase shift circuit according to (11) is connected to a power-feeding unit of the antenna. This makes it possible to configure the communication apparatus in which a reduction in size and a reduction in insertion loss have been achieved.

(14) A communication apparatus according to the present disclosure includes a plurality of antennas; and phase shifters connected to respective power-feeding units of all or some antennas of the plurality of antennas. The phase shifters are each the variable phase shifter according to any of the above (1) to (10) or are the variable phase shift circuit according to (11). This makes it possible to configure the communication apparatus including an array antenna in which a reduction in size and a reduction in insertion loss have been achieved.

According to the present disclosure, a variable phase shifter and another variable phase shifter are obtained in which the number of circuit components is small and which promotes a reduction in size and a reduction in insertion loss. Furthermore, the variable phase shift circuit, the RF front-end circuit, and the communication apparatus are obtained in which a reduction in size and a reduction in insertion loss have been achieved.

DETAILED DESCRIPTION

Figure 1:
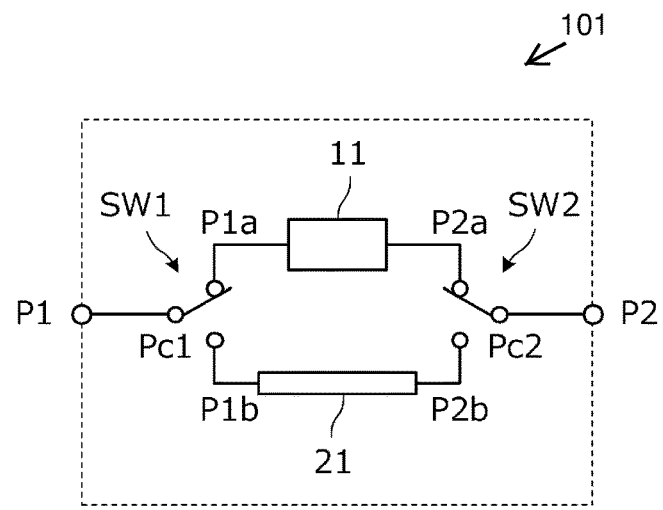
FIG. 1 is a circuit diagram of a variable phase shifter 101 according to a first embodiment.

A plurality of embodiments for implementing the present disclosure will be described below by giving some specific examples with reference to figures. In the figures, the same reference numerals denote the same elements. In consideration of ease of description or understanding of main points, the embodiments will be separately described for the sake of convenience. However, configurations described in different embodiments may be partially replaced or combined. In the second and subsequent embodiments, descriptions of things common to the first embodiment are omitted, and only differences will be described. In particular, similar function effects based on similar configurations are not repeatedly described in the embodiments.

First Embodiment

In the first embodiment, a variable phase shifter including a phase shifter, a through path, and two switches will be described.

FIG. 1 is a circuit diagram of a variable phase shifter 101 according to the first embodiment. The variable phase shifter 101 switches between the phase differences between two ports P1 and P2 by using switches SW1 and SW2. The variable phase shifter 101 is, directly or indirectly, connected to a power-feeding unit of an antenna, which is not illustrated.

The variable phase shifter 101 includes a phase shifter 11 that shifts a phase by a certain phase shift amount, a through path 21, the first switch SW1 that selects either a first port P1a of the phase shifter 11 or a first port P1b of the through path 21, and the second switch SW2 that selects either a second port P2a of the phase shifter 11 or a second port P2b of the through path 21. Then, the phase shift amounts between a common port Pc1 of the first switch SW1 and a common port Pc2 of the second switch SW2 are switched in accordance with the selections made by the first switch SW1 and the second switch SW2. The common port Pc1 of the switch SW1 is connected to the first port P1 of the variable phase shifter 101, and the common port Pc2 of the switch SW2 is connected to the second port P2 of the variable phase shifter 101.

The first switch SW1 corresponds to "first switch" according to the present disclosure, and the second switch SW2 corresponds to "second switch" according to the present disclosure. Both of the first switch SW1 and the second switch SW2 are each composed of a single pole double throw switch (SPDT).

Figure 2A:
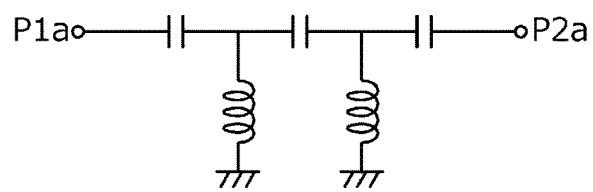
FIGS. 2A and 2B are each a circuit diagram illustrating an example of a circuit configuration of a phase shifter 11.
Figure 2B:
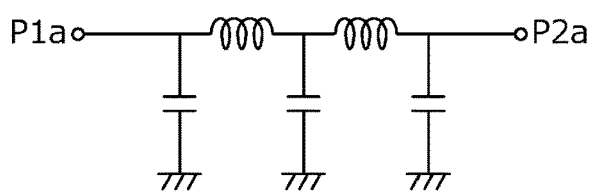

FIGS. 2A and 2B are each a circuit diagram illustrating an example of a circuit configuration of the phase shifter 11. FIGS. 2A and 2B each illustrate an LC ladder filter. FIG. 2A illustrates a high pass filter phase shifter, and FIG. 2B illustrates a low pass filter phase shifter. In the high pass filter type illustrated in FIG. 2A, a phase leads. In the low pass filter type illustrated in FIG. 2B, a phase lags. The amount by which the phase leads and the amount by which the phase lags are each decided by the number of stages of an LC ladder circuit.

The phase shifter 11 illustrated in FIG. 1 is a phase shifter including a lumped-constant LC circuit. The through path 21 illustrated in FIG. 1 is a distributed-constant transmission line.

A lumped-constant phase shifter has an advantage that the lumped-constant phase shifter can be acted upon mainly by a specific frequency band. For this reason, for example, in comparison with a circuit that switches between the through paths different in phase shift amount from each other by using switches, the circuit according to this embodiment that switches between the lumped-constant phase shifter and the through path has an advantage that the lumped-constant phase shifter can be acted upon mainly by a specific frequency band.

In FIG. 1, the phase shift amount of the phase shifter 11 is +90°, for example. The line length of the through path 21 is 0.01λ (λ=400 mm) when one wavelength is represented by λ, and the phase shift amount of the through path 21 is about −5°. The value of X may range from 50 mm to 500 mm (600 MHz to 6 GHz).

The first switch SW1 and the second switch SW2 are simultaneously switched by a control signal input externally. That is, when the first switch SW1 selects the port P1a, the second switch SW2 selects the port P2a. Similarly, when the first switch SW1 selects the port P1b, the second switch SW2 selects the port P2b. Thus, when the switches SW1 and SW2 select the phase shifter 11, the phase shift amount between the ports P1 and P2 is +90°, and, when the switches SW1 and SW2 select the through path 21, the phase shift amount between the ports P1 and P2 is about −5.0° (750 MHz).

Second Embodiment

In a second embodiment, an example of a variable phase shift circuit including the variable phase shifter described in the first embodiment will be described.

Figure 3:
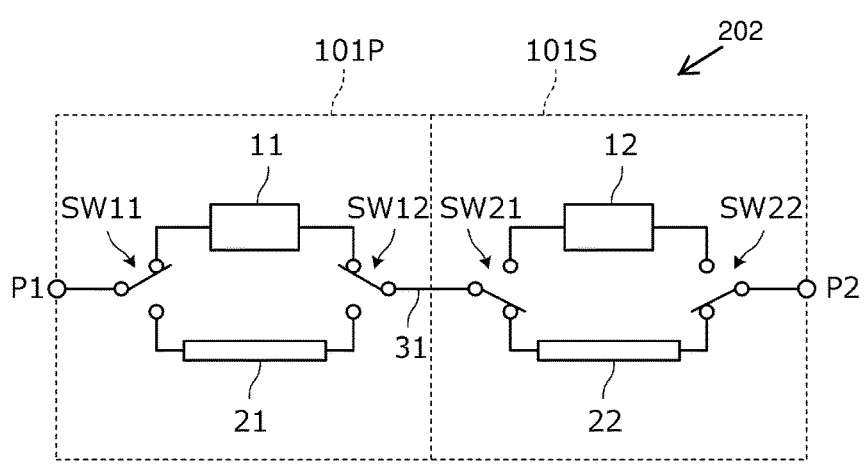
FIG. 3 is a circuit diagram of a variable phase shift circuit 202 according to a second embodiment.

FIG. 3 is a circuit diagram of a variable phase shift circuit 202 according to the second embodiment. The variable phase shift circuit 202 includes a variable phase shifter 101P and a variable phase shifter 101S that are connected in cascade via a transmission line 31. The configuration of each of the variable phase shifters 101P and 101S is the same as that of the variable phase shifter 101 illustrated in FIG. 1.

The first-stage variable phase shifter 101P includes the phase shifter 11, the through path 21, and switches SW11 and SW12. The second-stage variable phase shifter 101S includes a phase shifter 12, a through path 22, and switches SW21 and SW22.

In FIG. 3, there are four states obtained by combining two states of the switches SW11 and SW12 in the variable phase shifter 101P and two states of the switches SW21 and SW22 in the variable phase shifter 101S. Thus, a selection can be made from among four phase shift amounts. The phase shift amounts of the phase shifters 11 and 12 may be the same as each other or different from each other. The phase shift amounts of the through paths 21 and 22 may also be the same as each other or different from each other. For example, assuming that the phase shift amount of the phase shifter 11 is +90°, that the phase shift amount of the phase shifter 12 is +45°, and that the phase shift amounts of the through paths 21 and 22 are substantially 0°, a setting can be set to any of 0°, +45°, +90°, and +135°.

Figure 4:
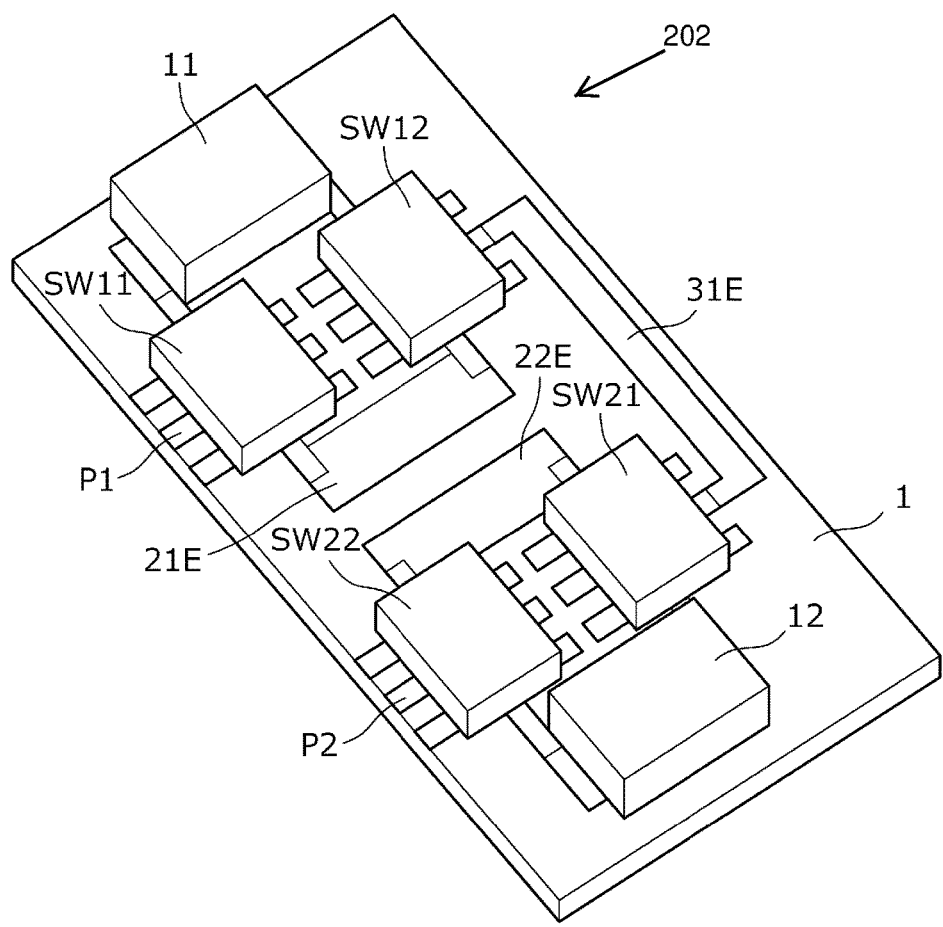
FIG. 4 is a perspective view of the variable phase shift circuit 202 illustrated in FIG. 3 that is constructed on a substrate.

FIG. 4 is a perspective view of the variable phase shift circuit 202 illustrated in FIG. 3 that is constructed on a substrate. The variable phase shift circuit 202 includes a substrate 1 on which a conductor pattern is formed, the phase shifters 11 and 12, and the switches SW11, SW12, SW21, and SW22. The phase shifters 11 and 12, and the switches SW11, SW12, SW21, and SW22 are mounted on the substrate 1. On the substrate 1, conductor patterns 21E, 22E, and 31E are formed. On a substantially whole lower surface of the substrate 1, a ground conductor is formed. The through paths 21 and 22 are constituted by the ground conductor, and the conductor patterns 21E and 22E formed on an upper surface of the substrate 1 to have a microstrip line structure. The transmission line 31 is constituted by the ground conductor and the conductor pattern 31E to have a microstrip line structure.

Third Embodiment

In a third embodiment, a variable phase shifter including a phase shifter, a through path, and one switch will be described.

Figure 5A:
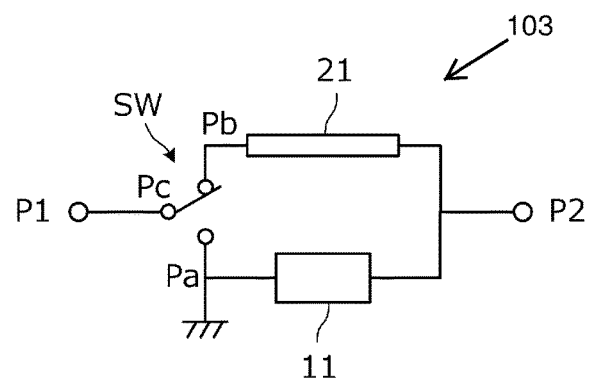
FIGS. 5A and 5B are each a circuit diagram of a variable phase shifter 103 according to a third embodiment.
Figure 5B:
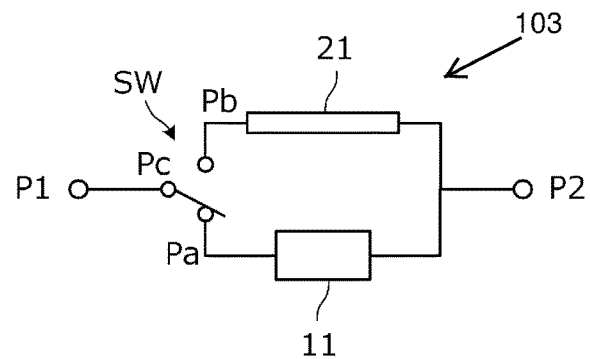
Figure 6A:
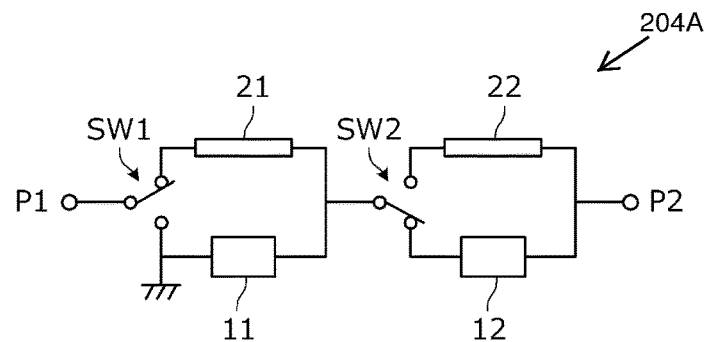
FIGS. 6A, 6B, 6C, and 6D are circuit diagrams of variable phase shift circuits 204A, 204B, 204C, and 204D according to a fourth embodiment.
Figure 6B:
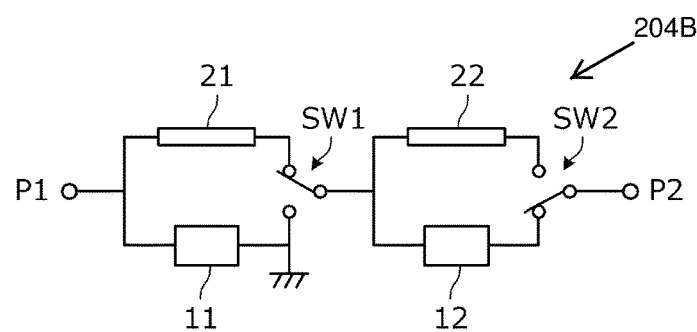
Figure 6C:
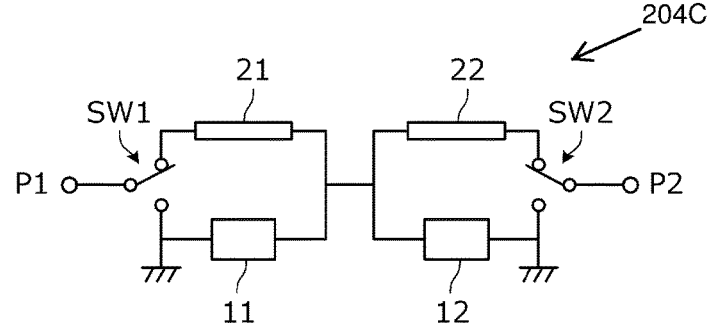
Figure 6D:
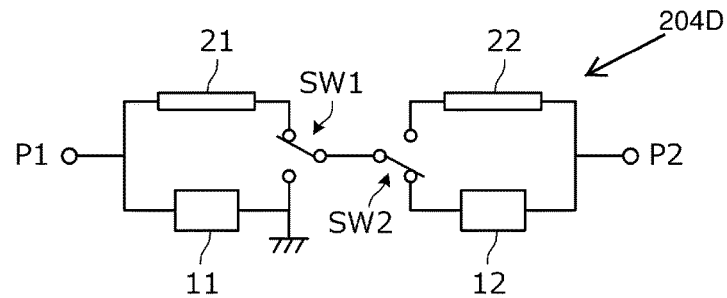

FIGS. 5A and 5B are each a circuit diagram of a variable phase shifter 103 according to the third embodiment. The variable phase shifter 103 switches between phase differences between two ports P1 and P2 by using a switch SW. The variable phase shifter 103 is directly or indirectly connected to the power-feeding unit of the antenna, which is not illustrated.

The variable phase shifter 103 includes the phase shifter 11 that shifts a phase by a certain phase shift amount, the through path 21, and the switch SW that selects either a port Pa of the phase shifter 11 or a port Pb of the through path 21. A common port Pc of the switch SW is connected to the first port P1 of the variable phase shifter 103. A common connection is made between the second ports of the phase shifter 11 and the through path 21 and is connected to the second port P2.

The variable phase shifter 103 switches between the phase shift amounts between the ports P1 and P2 in accordance with a selection made by the switch SW.

As illustrated in FIG. 5A, when the switch SW is selecting Pb, the first port Pa of the phase shifter 11 is connected to a ground (grounded). The phase shift amount of the phase shifter 11 is about 90° in a used frequency band. For this reason, the second port of the phase shifter 11 (the second port P2 of the variable phase shifter 103) is a point located $\lambda/4$ ($\lambda$: one wavelength) away from a ground point, and is thus equivalently open. Thus, as illustrated in FIG. 5A, the phase shifter 11 does not electrically affect the through path 21 with a through path 21 side being selected by the switch SW, and a signal is transmitted through the through path 21. On the other hand, when the switch SW is selecting Pa, the first port Pb of the through path 21 is open. The electrical length of the through path 21 is short as compared to $\lambda/4$ (the electrical length can be $\lambda/20$ or less), and the second port of the through path 21 (the second port P2 of the variable phase shifter 103) is thus equivalently open. As a result, this embodiment enables a reduction in the number of switches by one as compared to the structure illustrated in FIG. 1.

As illustrated in FIG. 5B, the through path 21 whose end (the first port Pb) is open is put into a state of being connected to the second port P2 with a phase shifter 11 side being selected by the switch SW. However, the electrical length of the through path 21 is short as compared to $\lambda/4$ (the electrical length is substantially zero), and thus reflections at the first port Pb present substantially no problem.

Fourth Embodiment

In a fourth embodiment, an example of a variable phase shift circuit including the variable phase shifter described in the third embodiment will be described.

FIGS. 6A, 6B, 6C, and 6D are circuit diagrams of variable phase shift circuits 204A, 204B, 204C, and 204D according to the fourth embodiment. The variable phase shift circuits 204A, 204B, 204C, and 204D each includes two stages of variable phase shifters 103 connected in cascade that are each illustrated in FIGS. 5A and 5B.

A first-stage variable phase shifter includes the phase shifter 11, the through path 21, and the switch SW1. A second-stage variable phase shifter includes the phase shifter 12, the through path 22, and the switch SW2.

The variable phase shifter 103 is an asymmetric circuit. Thus, as a connection structure of the two variable phase shifters, there are four connection structures illustrated in FIGS. 6A, 6B, 6C, and 6D. In all of the connection structures, a selection can be made from among four phase shift amounts obtained by combining two states of the switches SW1 and SW2.

Fifth Embodiment

In a fifth embodiment, an example of a variable phase shifter including a matching circuit located anterior or posterior to the variable phase shifter will be described.

Figure 7A:
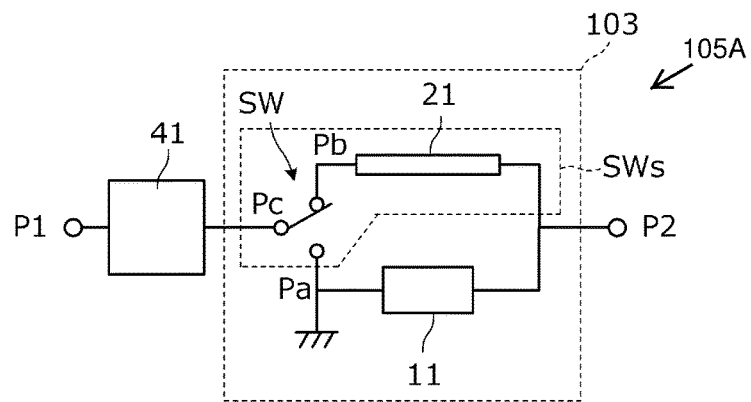
FIGS. 7A and 7B are circuit diagrams of variable phase shifters 105A and 105B according to a fifth embodiment.
Figure 7B:
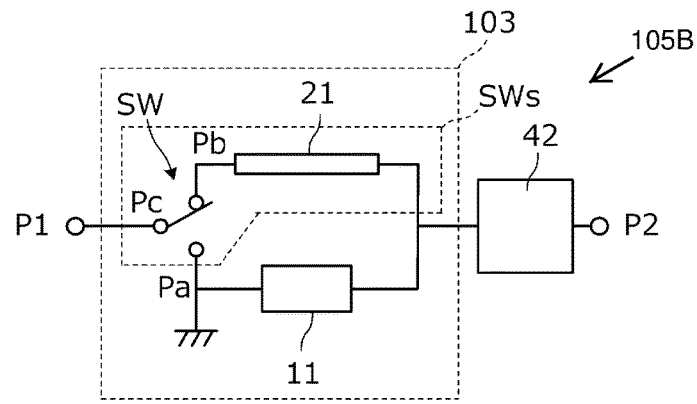

FIGS. 7A and 7B are circuit diagrams of variable phase shifters 105A and 105B according to the fifth embodiment. The variable phase shifter 105A includes an impedance matching circuit 41 connected to a switch SW side of the variable phase shifter 103 described in the third embodiment. The variable phase shifter 105B includes an impedance matching circuit 42 connected to a common connection portion side of the variable phase shifter 103 described in the third embodiment.

In the case where the phase shifter 11 included in the variable phase shifter 103 is a phase shifter composed of an LC filter circuit, the impedance of the phase shifter 11 varies according to a frequency. The impedance matching circuits 41 and 42 are provided for compensating for frequency characteristics of the impedance of the phase shifter 11. This makes it possible to match the variable phase shifters 105A and 105B to the impedances (for example, 50Ω) of circuits connected to the variable phase shifters 105A and 105B over a wide frequency band.

The through path 21 and the switch SW may be configured as a through-path-equipped switch element SWs, that is, as a single component. This reduces the number of components and a signal path length, thereby achieving a more effective reduction in size and a more effective reduction in insertion loss.

Figure 8:
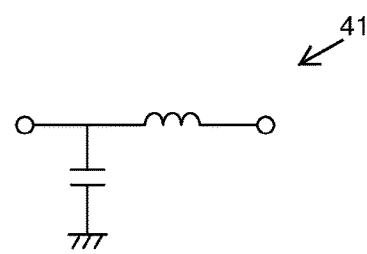
FIG. 8 illustrates an example of the configuration of an impedance matching circuit 41.
Figure 9A:
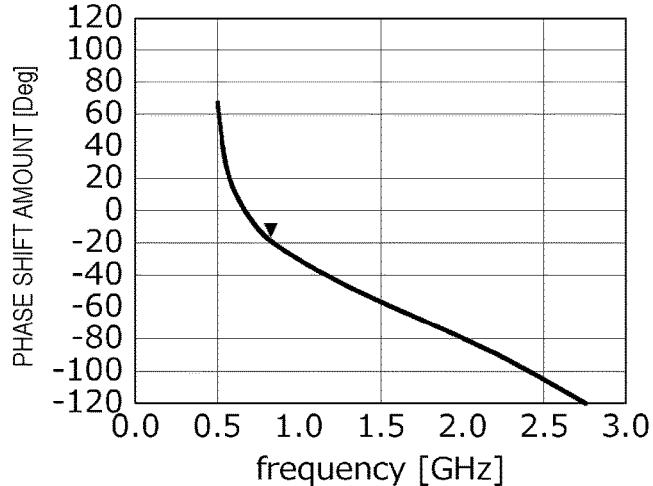
FIGS. 9A, 9B, and 9C illustrate characteristics in a state where a switch SW is selecting a through path 21 side in the variable phase shifter 105A.
Figure 9B:
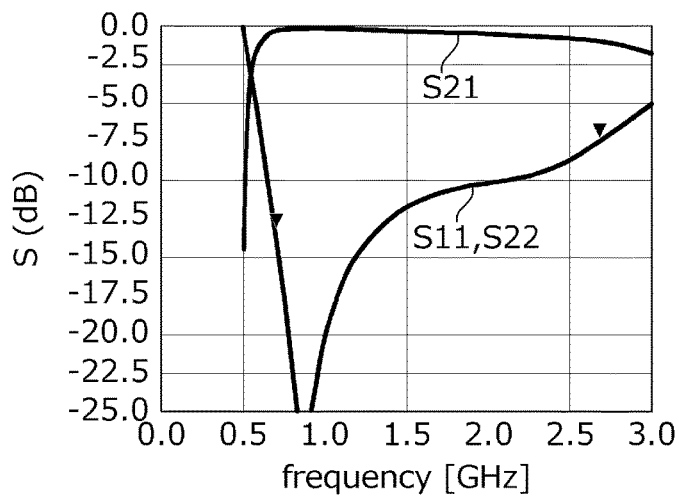
Figure 9C:
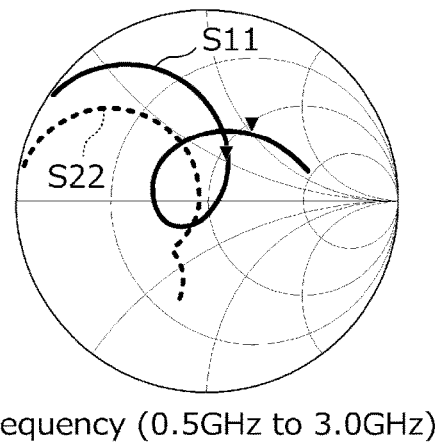
Figure 10A:
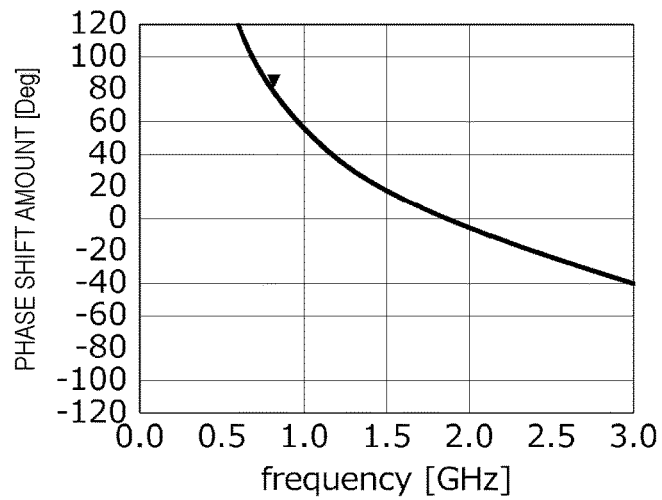
FIGS. 10A, 10B, and 10C illustrate characteristics in a state where the switch SW is selecting a phase shifter 11 side in the variable phase shifter 105A.
Figure 10B:
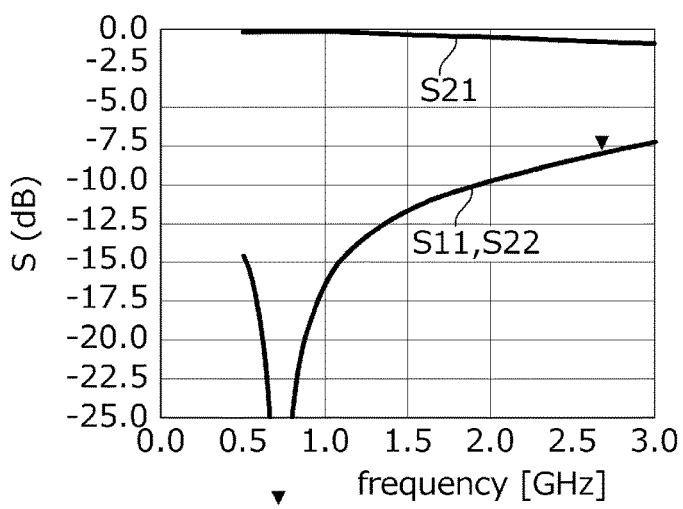
Figure 10C:
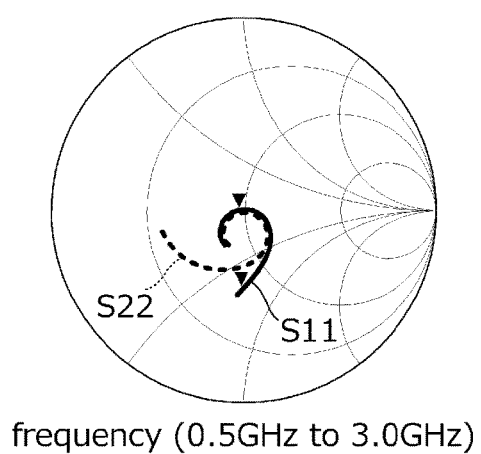
Figure 11A:
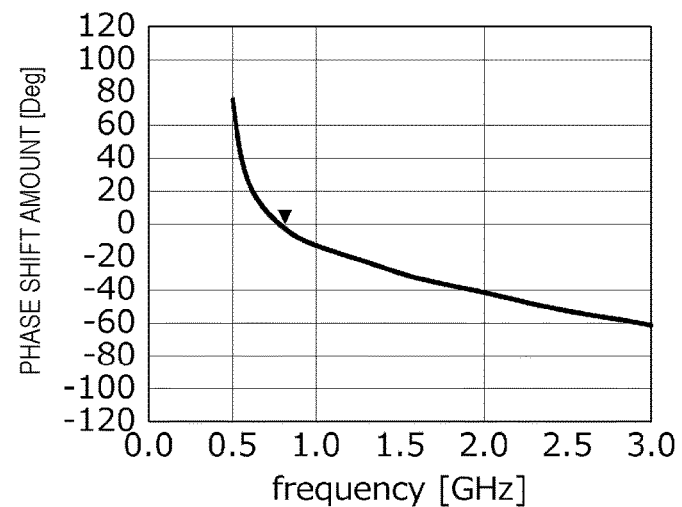
FIGS. 11A, 11B, and 11C illustrate characteristics in a state where the switch SW is selecting the through path 21 side in the case where the impedance matching circuit 41 is not provided in FIG. 7A.
Figure 11B:
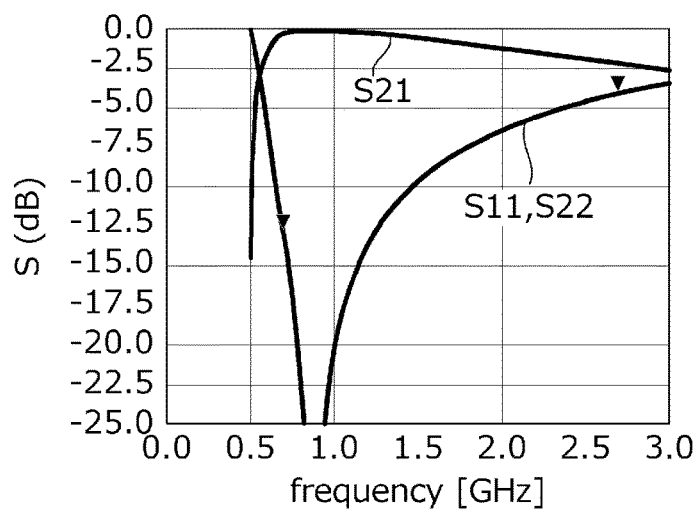
Figure 11C:
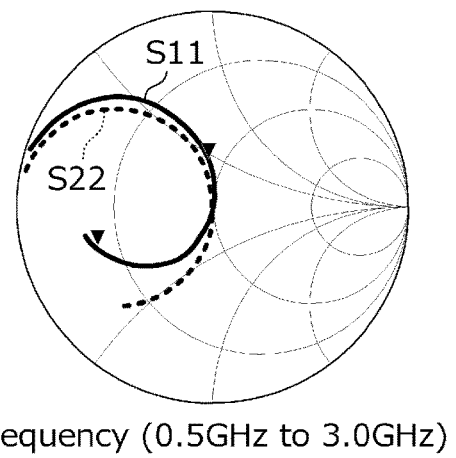
Figure 12A:
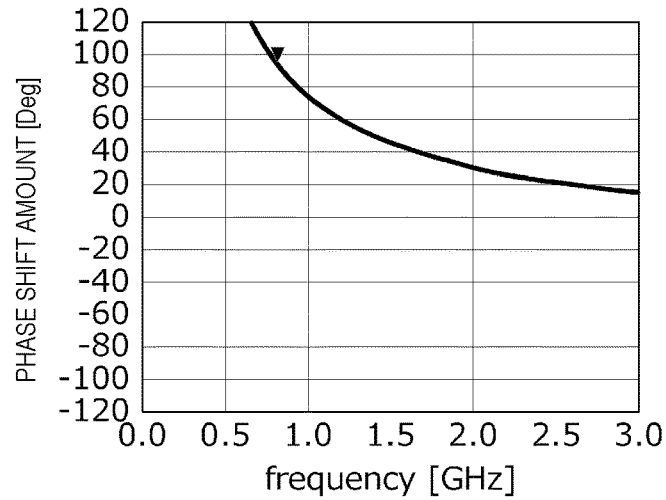
FIGS. 12A, 12B, and 12C illustrate characteristics in a state where the switch SW is selecting the phase shifter 11 side in the case where the impedance matching circuit 41 is not provided in FIG. 7A.
Figure 12B:
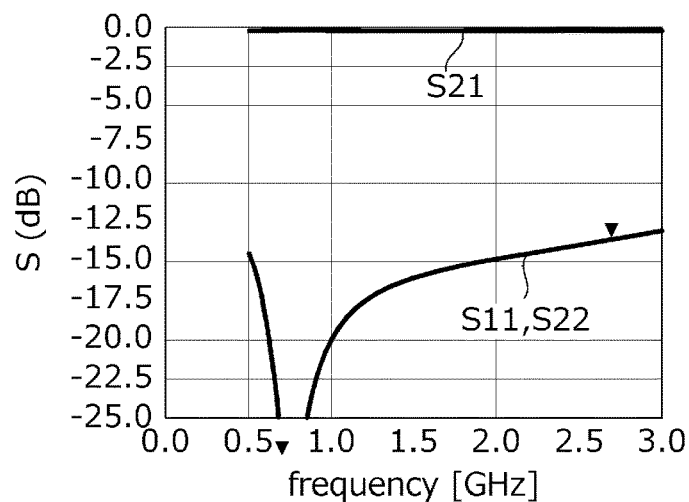
Figure 12C:
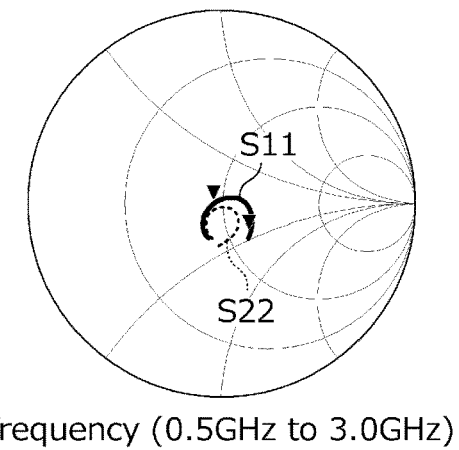

FIG. 8 illustrates an example of the configuration of the impedance matching circuit 41. FIGS. 9A, 9B, and 9C illustrate characteristics in a state where the switch SW is selecting the through path 21 side in the variable phase shifter 105A. FIGS. 10A, 10B, and 10C illustrate characteristics in a state where the switch SW is selecting the phase shifter 11 side in the variable phase shifter 105A. FIGS. 11A, 11B, and 11C illustrate characteristics in a state where the switch SW is selecting the through path 21 side in the case where the impedance matching circuit 41 is not provided in FIG. 7A. FIGS. 12A, 12B, and 12C illustrate characteristics in a state where the switch SW is selecting the phase shifter 11 side in the case where the impedance matching circuit 41 is not provided in FIG. 7A.

FIGS. 9A, 10A, 11A, and 12A, each illustrates a frequency characteristic of a phase shift amount. FIGS. 9B, 10B, 11B, and 12B, each illustrates frequency characteristics of a return loss and an insertion loss. FIGS. 9C, 10C, 11C, and 12C, each illustrates frequency characteristics of reflection coefficients on a Smith chart. In FIGS. 9B, 10B, 11B, and 12B, S11 represents a return loss when viewed from the port P1, S22 represents a return loss when viewed from the port P2, and S21 represents an insertion loss. Also, in FIGS. 9C, 10C, 11C, and 12C, S11 represents a reflection coefficient when viewed from the port P1, and S22 represents a reflection coefficient when viewed from the port P2.

As is clear by comparing FIGS. 9B and 9C with FIGS. 11B and 11C, impedance matching is achieved by the action of the impedance matching circuit 41 illustrated in FIG. 7A over a wide frequency band. Furthermore, as is clear by comparing FIG. 9A with FIG. 11A, there is little change in the phase shift amount at a certain frequency, and it is found that the matching circuit 41 does not affect the phase shift amount much.

As is clear by comparing FIGS. 10B and 10C with FIGS. 12B and 12C, the connection of the matching circuit 41 illustrated in FIG. 7A makes the return loss (S11, S22) slightly worse; however, it is found that −7.5 dB can be ensured. Furthermore, as is clear by comparing FIG. 10A with FIG. 12A, there is little change in the phase shift amount at a certain frequency (matching frequency), and it is found that the matching circuit 41 does not affect the phase shift amount much.

Sixth Embodiment

In a sixth embodiment, an example of a variable phase shifter will be described that includes a phase shifter, a through path, and one switch, and that also includes a reactance circuit located between the phase shifter and the ground.

Figure 13A:
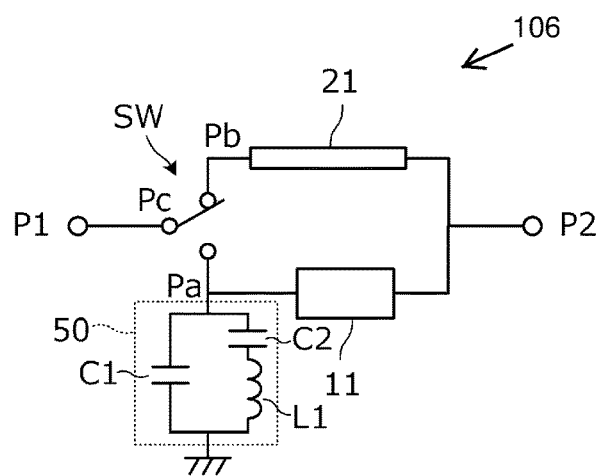
FIGS. 13A and 13B are each a circuit diagram of a variable phase shifter 106 according to a sixth embodiment.
Figure 13B:
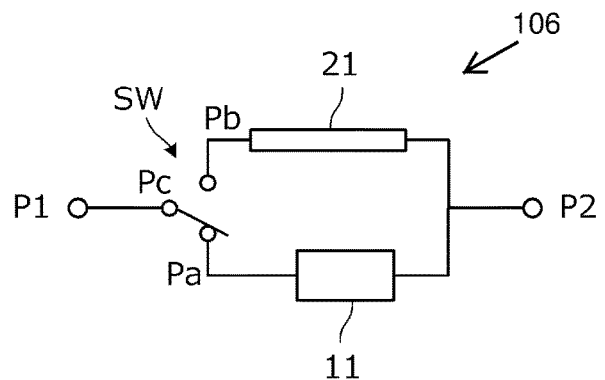

FIGS. 13A and 13B are each a circuit diagram of a variable phase shifter 106 according to the sixth embodiment. The variable phase shifter 106 switches between phase differences between the two ports P1 and P2 by using the switch SW.

The variable phase shifter 106 includes the phase shifter 11 that shifts a phase by a certain phase shift amount, the through path 21, and the switch SW that selects either the port Pa of the phase shifter 11 or the port Pb of the through path 21. When the switch SW is selecting the through path 21, a reactance circuit 50 is connected between the port Pa of the phase shifter 11 and the ground. When the switch SW is selecting the phase shifter 11, the port Pb of the through path 21 is opened. The switch SW has such a configuration.

In the examples illustrated in FIGS. 5A and 5B in the third embodiment, in the case of the use in a plurality of frequency bands, mismatching may be caused in any of the frequency bands. For example, even a phase shifter that appears to be λ/4 in length at 900 MHz appears to be λ/2 in length at 1.8 GHz. For this reason, when the first port Pa of the phase shifter 11 is connected to the ground, the second port (the second port P2 of the variable phase shifter 103) appears to be equivalently open at 900 MHz, but does not appear to be equivalently open at 1.8 GHz. This results in mismatching at 1.8 GHz. That is, an input or output becomes out of 50Ω.

Thus, as illustrated in FIG. 13A, the first port Pa of the phase shifter 11 is grounded via the reactance circuit 50 composed of an inductor L1 and capacitors C1 and C2, thereby enabling matching even at 1.8 GHz.

Then, in the case where two or more frequency bands are used, a reactance value in a lower frequency band is set to a low impedance, and a reactance value in a higher frequency band is set to a high impedance, thereby making it possible to maintain matching in a plurality of frequency bands. For example, in the case where a 900 MHz band and a 1.8 GHz band are used, settings are set so as to achieve a low impedance at about 900 MHz and so as to achieve a high impedance at about 1.8 GHz, thereby making it possible to maintain a plurality of matching conditions.

Figure 14:
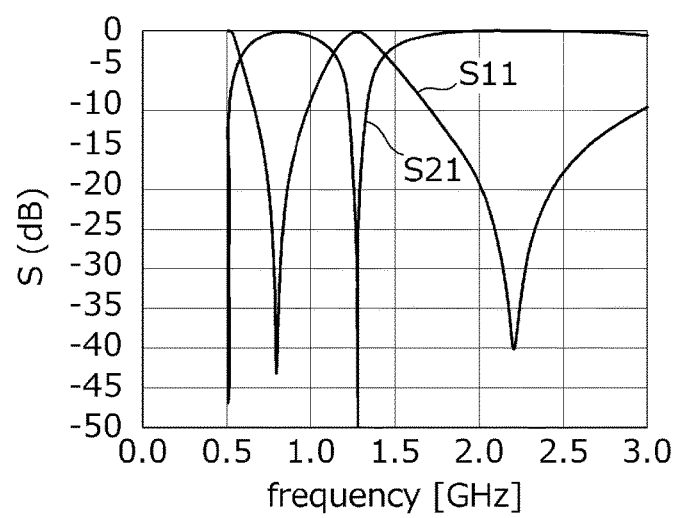
FIG. 14 illustrates frequency characteristics of an insertion loss and a return loss in the circuit illustrated in FIG. 13.

FIG. 14 illustrates frequency characteristics of an insertion loss and a return loss in the circuit illustrated in FIGS. 13A and 13B. In FIG. 14, S11 represents a return loss when viewed from the port P1, and S21 represents an insertion loss between the ports P1 and P2.

For example, in FIG. 13A, the impedance of the reactance circuit 50 decreases due to series resonance of the capacitor C2 and the inductor L1 at about 900 MHz, a series circuit of the capacitor C2 and the inductor L1 becomes inductive in a frequency band higher than 900 MHz, the resultant inductance and the capacitor C1 causes parallel resonance to occur at a certain frequency, and a high impedance is achieved at a resonance point of the parallel resonance. At frequencies beyond a frequency at the resonance point, the impedance gradually changes to a low impedance. Thus, in the case where the phase shifter 11 is a λ/4 phase shifter, in both of the 900 MHz band and the 1.8 GHz band, the second port of the phase shifter 11 is equivalently in an open state with the through path 21 being selected by the switch SW, and there is little influence of the phase shifter 11.

Also, in the examples illustrated in FIGS. 7A and 7B, a reactance circuit equivalent to the reactance circuit 50 illustrated in FIG. 13A may be provided between the first port Pa of the phase shifter 11 and the ground.

Seventh Embodiment

In a seventh embodiment, an example of a variable phase shift circuit will be described that uses a component into which one through path and two switches are integrated.

Figure 15:
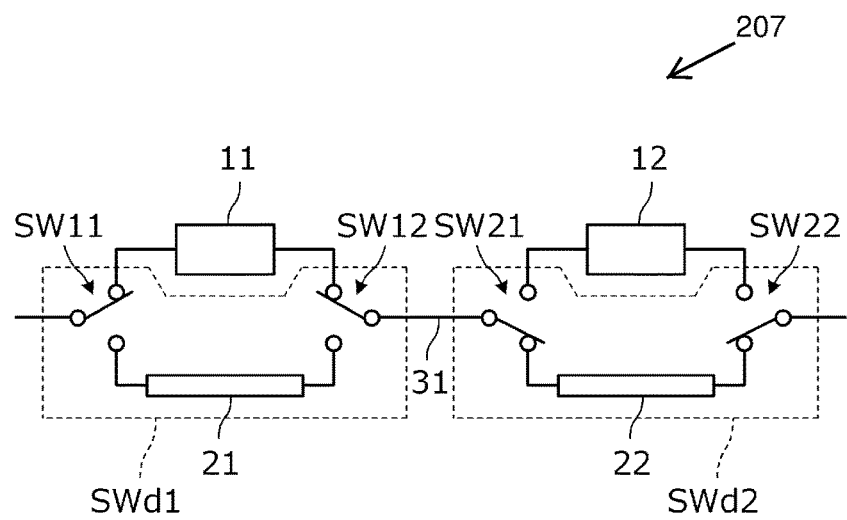
FIG. 15 is a circuit diagram of a variable phase shift circuit 207 according to a seventh embodiment.

FIG. 15 is a circuit diagram of a variable phase shift circuit 207 according to the seventh embodiment. The circuit of the variable phase shift circuit 207 is the same as that of the variable phase shift circuit 202 illustrated in FIG. 3 in the second embodiment. In this embodiment, the through path 21, and the switches SW11 and SW12 are configured as a through-path-equipped switch element SWd1, that is, as a single component. Similarly, the through path 22, and the switches SW21 and SW22 are configured as a through-path-equipped switch element SWd2.

Figure 16:
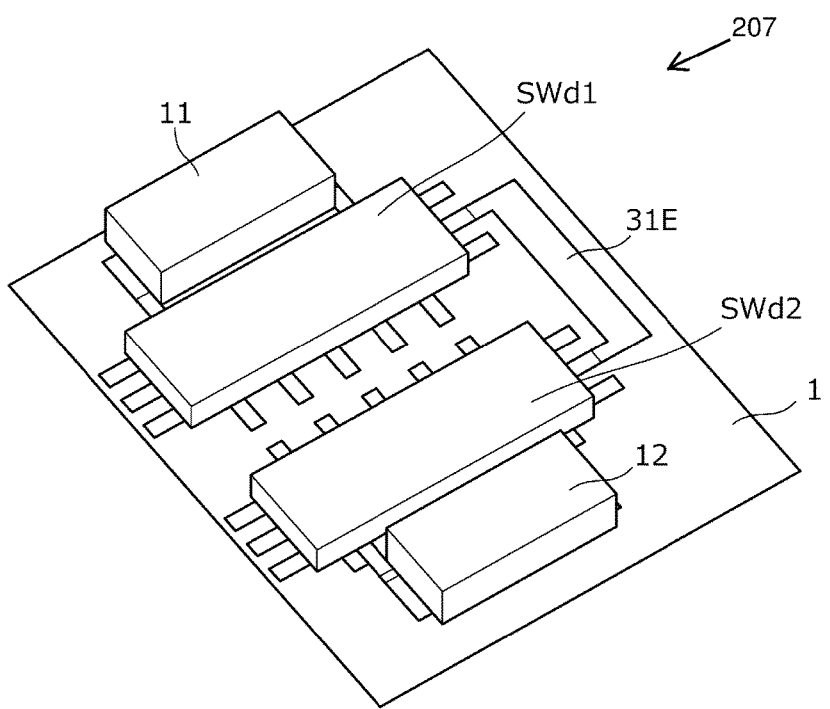
FIG. 16 is a perspective view of the variable phase shift circuit 207 constructed on the substrate.

FIG. 16 is a perspective view of the variable phase shift circuit 207 constructed on the substrate. The variable phase shift circuit 207 includes the substrate 1 on which a conductor pattern is formed, the phase shifters 11 and 12, and the through-path-equipped switch elements SWd1 and SWd2. The phase shifters 11 and 12, and the through-path-equipped switch elements SWd1 and SWd2 are mounted on the substrate 1. On the substrate 1, the transmission line 31 is constituted by the conductor pattern 31E formed on the upper surface and the ground conductor formed on the lower surface to have a microstrip line structure.

Thus, when a through-path-equipped switch element is configured and used, the number of components and a signal path length are reduced, thereby achieving a more effective reduction in size and a more effective reduction in insertion loss.

Eighth Embodiment

In an eighth embodiment, an example of a variable phase shift circuit will be described that uses a component into which two through paths and four switches are integrated.

Figure 17:
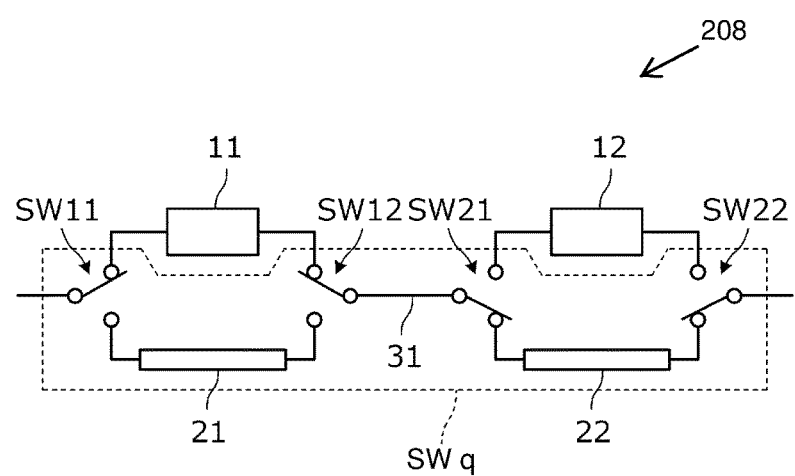
FIG. 17 is a circuit diagram of a variable phase shift circuit 208 according to an eighth embodiment.

FIG. 17 is a circuit diagram of a variable phase shift circuit 208 according to the eighth embodiment. The circuit of the variable phase shift circuit 208 is the same as that of the variable phase shift circuit 202 illustrated in FIG. 3 in the second embodiment. In this embodiment, the through paths 21 and 22, and the switches SW11, SW12, SW21, and SW22 are configured as a through-path-equipped switch element SWq, that is, as a single component.

Figure 18:
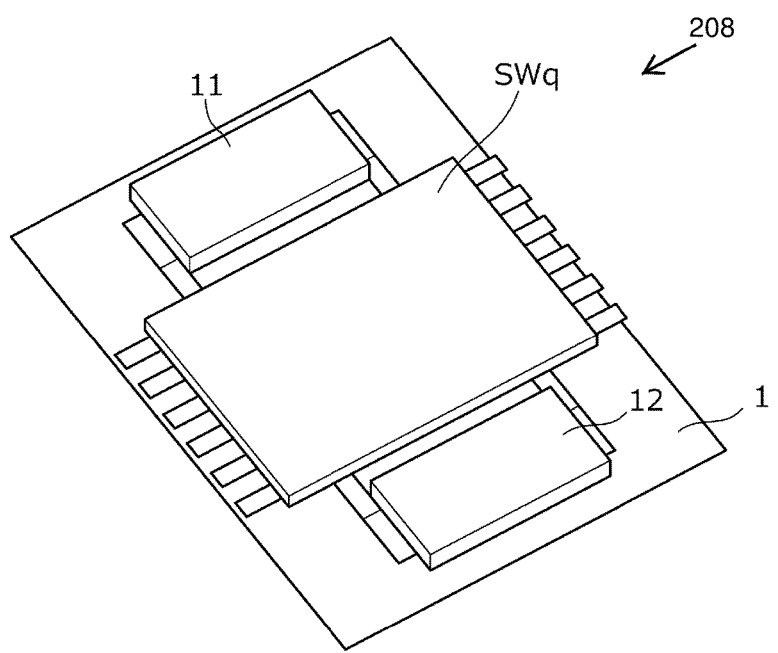
FIG. 18 is a perspective view of the variable phase shift circuit 208 constructed on the substrate.

FIG. 18 is a perspective view of the variable phase shift circuit 208 constructed on the substrate. The variable phase shift circuit 208 includes the substrate 1 on which a conductor pattern is formed, the phase shifters 11 and 12, and the through-path-equipped switch element SWq. The phase shifters 11 and 12, and the through-path-equipped switch element SWq are mounted on the substrate 1.

Thus, when elements other than the phase shifters 11 and 12 are configured as a single component and used, the number of components and a signal path length are reduced, thereby achieving a more effective reduction in size and a more effective reduction in insertion loss.

Ninth Embodiment

In a ninth embodiment, an example of an RF front-end circuit and a communication apparatus will be described.

Figure 19:
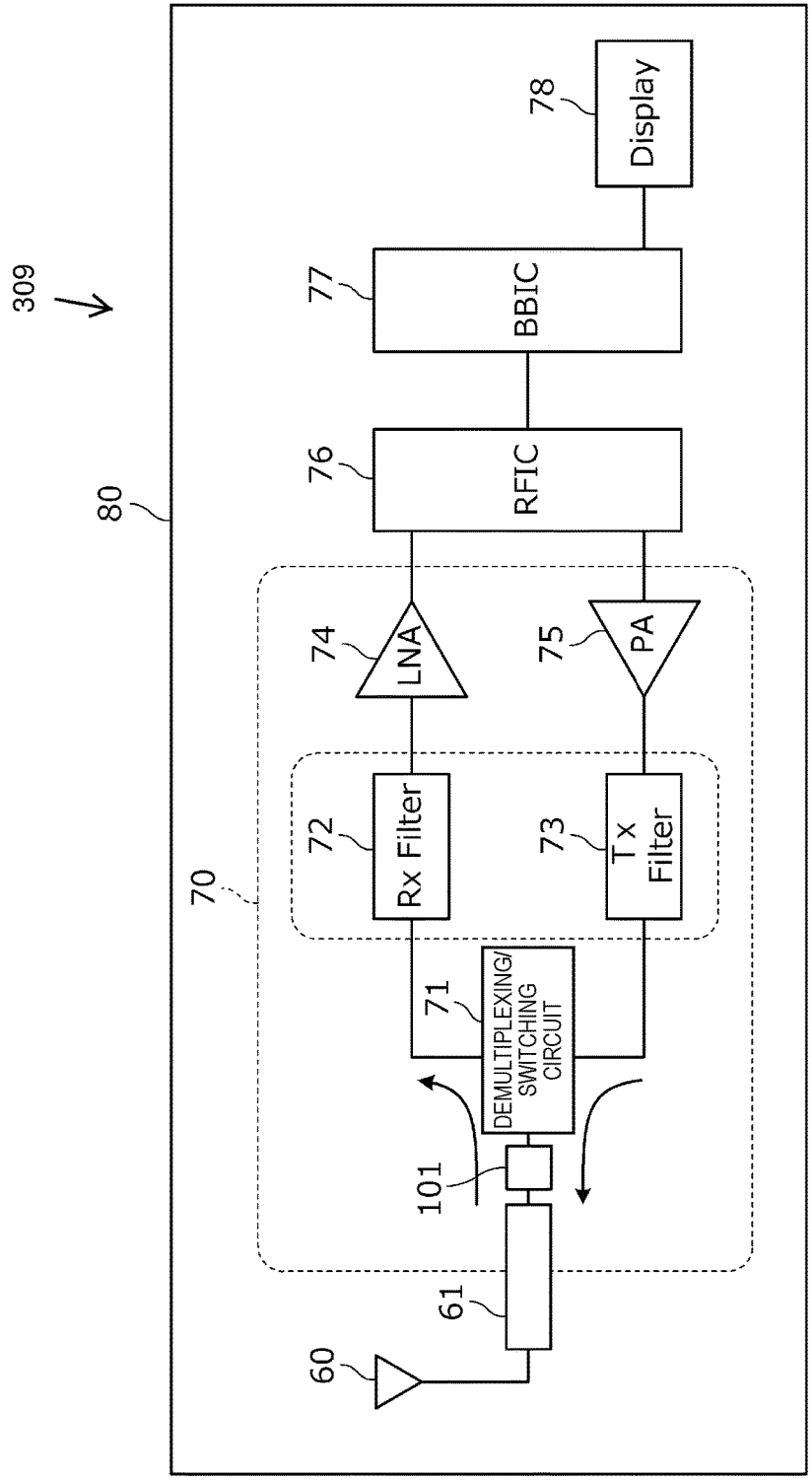
FIG. 19 is a block diagram of a communication apparatus 309 according to a ninth embodiment.

FIG. 19 is a block diagram of a communication apparatus 309 according to the ninth embodiment. The communication apparatus 309 is a cellular phone, for example. An antenna matching circuit 61 is connected to an antenna 60. The variable phase shifter 101 is provided between the antenna matching circuit 61 and a demultiplexing/switching circuit 71. The configuration of the variable phase shifter 101 is as illustrated in FIG. 1. A low-noise amplifier 74 is provided between an RFIC 76 and a reception filter 72, and a power amplifier 75 is provided between the RFIC 76 and a transmission filter 73. The RFIC 76 and a display device 78 are connected to a baseband IC 77. The antenna matching circuit 61, the variable phase shifter 101, the demultiplexing/switching circuit 71, the reception filter 72, the transmission filter 73, the low-noise amplifier 74, and the power amplifier 75 are configured as one RF front-end circuit (one module component) 70. The above-described components are provided within a casing 80. For example, when mismatching occurs due to the proximity of a hand or the like to an antenna, power from a power amplifier is reflected by the antenna and returns to the power amplifier, thereby causing an increase in power consumption or distortion. However, when the phase of a reflected wave is changed by a phase shifter, various characteristics of the power amplifier can be improved.

Tenth Embodiment

In a tenth embodiment, an example of a communication apparatus will be described that enables control of the directivity of an antenna.

Figure 20:
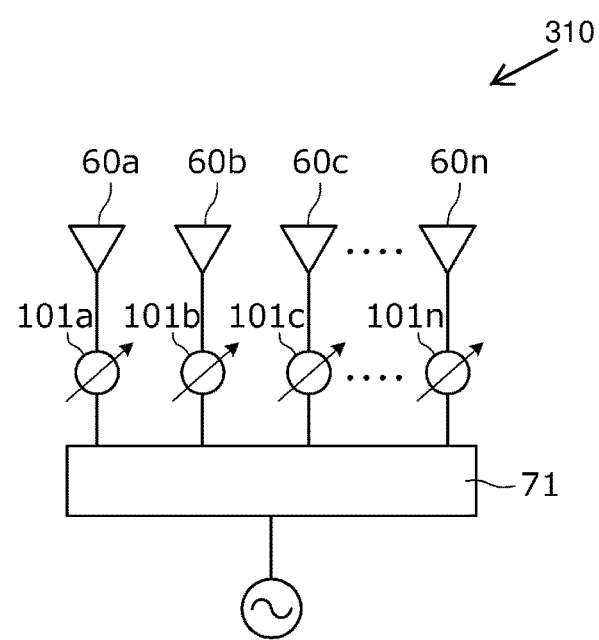
FIG. 20 illustrates the configuration of an array antenna unit of a communication apparatus 310 according to a tenth embodiment.

FIG. 20 is a block diagram illustrating the configuration of an array antenna unit of a communication apparatus 310 according to the tenth embodiment. In this example, variable phase shifters 101a, 101b, 101c, . . . 101n are respectively inserted between a plurality of antennas 60a, 60b, 60c, . . . 60n, and the demultiplexing/switching circuit 71. Thus, a plurality of antennas are used, and variable phase shifters are provided for the respective antennas to thereby constitute an array antenna unit. The variable phase shifter already described in each embodiment may be used for the variable phase shifters 101a, 101b, 101c, . . . 101n of this array antenna unit.

Finally, descriptions of the above-described embodiments are merely illustrative and not restrictive in every respect. Modifications and changes may be made as appropriate by those skilled in the art. For example, configurations described in different embodiments may be partially replaced or combined. The scope of the present disclosure is defined not by the above-described embodiments, but by the claims. Furthermore, the scope of the present disclosure is intended to include all changes made within the meaning and scope equivalent to the claims.

REFERENCE SIGNS LIST

C1, C2 capacitor
L1 inductor
P1, P1a, P1b first port
P2, P2a, P2b second port
Pa, Pb first port
Pc common port
Pc1, Pc2 common port
SW single pole double throw switch
SW1 first single pole double throw switch (first switch)
SW11, SW12, SW21, SW22 switch
SW2 second single pole double throw switch (second switch)
SWd1, SWd2 through-path-equipped switch element
SWq through-path-equipped switch element
1 substrate
11, 12 phase shifter
21, 22 through path
21E, 22E, 31E conductor pattern
31 transmission line
41, 42 impedance matching circuit
50 reactance circuit
60, 60a, 60b, 60c, 60n antenna
61 antenna matching circuit
71 demultiplexing/switching circuit
72 reception filter
73 transmission filter
74 low-noise amplifier
75 power amplifier
76 RFIC
78 display device
80 casing
101, 101a, 101b, 101c, 101n variable phase shifter
101P, 101S variable phase shifter
103 variable phase shifter
105A, 105B, 106 variable phase shifter
202 variable phase shift circuit
204A, 204B, 204C, 204D variable phase shift circuit
207, 208 variable phase shift circuit
309, 310 communication apparatus

The invention claimed is:

1. A communication apparatus comprising:
an antenna for a wide frequency band or a plurality of frequency bands;
a feeder circuit for the antenna; and
a variable phase shifter connected to a power-feeder circuit of the antenna, the variable phase shifter comprising:
a phase shifter comprising a first port and a second port;
a through path comprising a first port and a second port;
a first switch comprising a first common port, the first switch being configured to selectively connect the first port of the phase shifter or the first port of the through path to the first common port; and
a second switch including a second common port, the second switch being configured to selectively connect the second port of the phase shifter or the second port of the through path to the second common port.

2. The communication apparatus according to claim 1, wherein the phase shifter includes a lumped-constant LC circuit.

3. The communication apparatus according to claim 1, wherein the first switch, the second switch, and the through path are configured as a single component to be mounted on a substrate.

4. A variable phase shifter connected to an antenna, the variable phase shifter comprising:
   a phase shifter comprising a first port and a second port;
   a through path comprising a first port and a second port; and
   a switch comprising a common port and being configured to selectively connect the first port of the phase shifter or the first port of the through path to the common port,
   wherein a length of the through path is less than ¼ of a wavelength of a lowest frequency of a communication signal passing through the variable phase shifter and using the antenna,
   wherein the phase shifter is configured to cause a phase shift between 85° and 95°, inclusive, at a particular frequency of communication signal passing through the phase shifter, and
   wherein while the common port of the switch is selectively connected to the first port of the through path, the first port of the phase shifter is grounded, and while the common port of the switch is selectively connected to the first port of the phase shifter, the first port of the through path is opened.

5. The variable phase shifter according to claim 4, wherein the length of the through path is less than ¹⁄₂₀ of the wavelength of the lowest frequency of the communication signal passing through the variable phase shifter and using the antenna.

6. The variable phase shifter according to claim 4, wherein the phase shifter includes a lumped-constant LC circuit.

7. The variable phase shifter according to claim 4, further comprising a reactance circuit connected between the first port of the phase shifter and ground,
   wherein while the common port of the switch is selectively connected to the first port of the through path, the first port of the phase shifter is grounded via the reactance circuit.

8. The variable phase shifter according to claim 7, wherein the reactance circuit comprises a first capacitor, a second capacitor, and an inductor, and
   wherein the first capacitor and the inductor are connected in series, and the second capacitor is connected in parallel with the first capacitor and the inductor.

9. The variable phase shifter according to claim 4, further comprising a matching circuit connected to the common port of the switch or to a node between the second port of the phase shifter and the second port of the through path.

10. The variable phase shifter according to claim 4, wherein the switch and the through path are configured as a single component to be mounted on a substrate.

11. A variable phase shift circuit comprising a plurality of variable phase shifters according to claim 4, wherein the plurality of variable phase shifters are cascade connected.

12. An RF front-end circuit connected between an antenna and a feeder circuit, the antenna being for a wide frequency band or a plurality of frequency bands, the RF front-end circuit comprising:
   a demultiplexing switching circuit configured to perform demultiplexing or switching of a high-frequency signal; and
   the variable phase shifter according to claim 4 connected between the demultiplexing switching circuit and a power-feeder circuit of the antenna.

13. A communication apparatus comprising:
   an antenna for a wide frequency band or a plurality of frequency bands; and
   a feeder circuit for the antenna,
   wherein the variable phase shifter according to claim 4 is connected to a power-feeder circuit of the antenna.

14. A communication apparatus comprising:
   a plurality of antennas; and
   a plurality of phase shifters connected to respective power-feeder circuits of the plurality of antennas,
   wherein the phase shifters are each the variable phase shifter according to claim 4.

15. An RF front-end circuit connected between an antenna and a feeder circuit, the antenna being for a wide frequency band or a plurality of frequency bands, the RF front-end circuit comprising:
   a demultiplexing switching circuit configured to perform demultiplexing or switching of a high-frequency signal; and
   a variable phase shifter connected between the demultiplexing switching circuit and a power-feeder circuit of the antenna, the variable phase shifter comprising:
   a phase shifter comprising a first port and a second port;
   a through path comprising a first port and a second port;
   a first switch comprising a first common port, the first switch being configured to selectively connect the first port of the phase shifter or the first port of the through path to the first common port; and
   a second switch including a second common port, the second switch being configured to selectively connect the second port of the phase shifter or the second port of the through path to the second common port.

16. A communication apparatus comprising:
   a plurality of antennas; and
   a plurality of phase shifters connected to respective power-feeder circuits of the plurality of antennas,
      wherein the phase shifters are each a variable phase shifter comprising:
      a phase shifter comprising a first port and a second port;
      a through path comprising a first port and a second port;
      a first switch comprising a first common port, the first switch being configured to selectively connect the first port of the phase shifter or the first port of the through path to the first common port; and
   a second switch including a second common port, the second switch being configured to selectively connect the second port of the phase shifter or the second port of the through path to the second common port.

17. A variable phase shifter comprising:
   a phase shifter comprising a first port and a second port;
   a through path comprising a first port and a second port; and
   a switch comprising a common port and being configured to selectively connect the first port of the phase shifter or the first port of the through path to the common port,
   wherein when the common port of the switch is selectively connected to the first port of the through path, the first port of the phase shifter is grounded, and when the common port of the switch is selectively connected to the first port of the phase shifter, the first port of the through path is opened.

* * * * *

UNITED STATES PATENT AND TRADEMARK OFFICE
CERTIFICATE OF CORRECTION

PATENT NO. : 10,284,165 B2
APPLICATION NO. : 15/923028
DATED : May 7, 2019
INVENTOR(S) : Kengo Onaka et al.

It is certified that error appears in the above-identified patent and that said Letters Patent is hereby corrected as shown below:

In the Specification

Column 6, Line 8, "value of X" should read -- value of $\lambda$ --

Column 6, Line 31, "phase shifter 1015" should read -- phase shifter 101S --

Column 6, Line 33, "phase shifters 101P and 1015" should read -- phase shifters 101P and 101S --

Column 6, Line 37, "phase shifter 1015" should read -- phase shifter 101S --

Column 6, Line 44, "phase shifter 1015." should read -- phase shifter 101S. --

Column 12, Line 42, "101P, 1015" should read -- 101P, 101S --

Signed and Sealed this
Twenty-ninth Day of September, 2020

Andrei Iancu
*Director of the United States Patent and Trademark Office*